US012568773B2

(12) United States Patent
Bonderson et al.

(10) Patent No.: US 12,568,773 B2
(45) Date of Patent: Mar. 3, 2026

(54) TUNABLE GROUND CONNECTION TO MAJORANA ZERO MODES

(71) Applicant: Microsoft Technology Licensing, LLC, Redmond, WA (US)

(72) Inventors: Parsa Bonderson, Santa Barbara, CA (US); Christina Paulsen Knapp, Goleta, CA (US); Roman Bela Bauer, Santa Barbara, CA (US); Emily Anne Toomey, Santa Barbara, CA (US); David Alexander Aasen, Santa Barbara, CA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 392 days.

(21) Appl. No.: 18/332,653

(22) Filed: Jun. 9, 2023

(65) Prior Publication Data

US 2024/0415028 A1 Dec. 12, 2024

(51) Int. Cl.
| | |
|---|---|
| *H10N 60/10* | (2023.01) |
| *H01L 23/522* | (2006.01) |
| *H10D 30/47* | (2025.01) |

(52) U.S. Cl.
CPC ......... *H10N 60/11* (2023.02); *H01L 23/5226* (2013.01); *H10D 30/47* (2025.01)

(58) Field of Classification Search
CPC ..... H10N 60/11; H10D 30/47; H01L 23/5226

USPC ........................................................... 257/30
See application file for complete search history.

(56) References Cited

U.S. PATENT DOCUMENTS 11,808,796 B2 * 11/2023 Pikulin ................. G01R 27/02

OTHER PUBLICATIONS

Karzig et al., "Scalable designs for quasiparticle-poisoning-protected topological quantum computation with Majorana zero modes," Physical Review B, vol. 95, No. 235305, Jun. 23, 2017, 34 pages.
Invitation to Pay Additional Fees received for PCT Application No. PCT/US2024/032433, mailed on Nov. 3, 2025, 12 pages.
International Search Report and Written Opinion received for PCT Application No. PCT/US2024/032433, Mailed on Jan. 2, 2026, 20 Pages.

* cited by examiner

*Primary Examiner* — Tu-Tu V Ho
(74) *Attorney, Agent, or Firm* — Alleman Hall & Tuttle LLP

(57) ABSTRACT

A computing system is presented. The computing system comprises a Majorana island at which a plurality of Majorana zero modes are instantiated, and a grounded region tunably coupled to one of the Majorana zero modes. The grounded region comprises at least a two-dimensional electron gas (2DEG) layer. A first dielectric layer is adjacent to the 2DEG layer. A grounded gate directly contacts the 2DEG layer through a via fill.

20 Claims, 10 Drawing Sheets

400

412

402

408

406

410

404

420

428

422

426

430

424

440

442

450

454

452

444

448

450

446

460

462

470

474

478

464

468

466

470

476

472

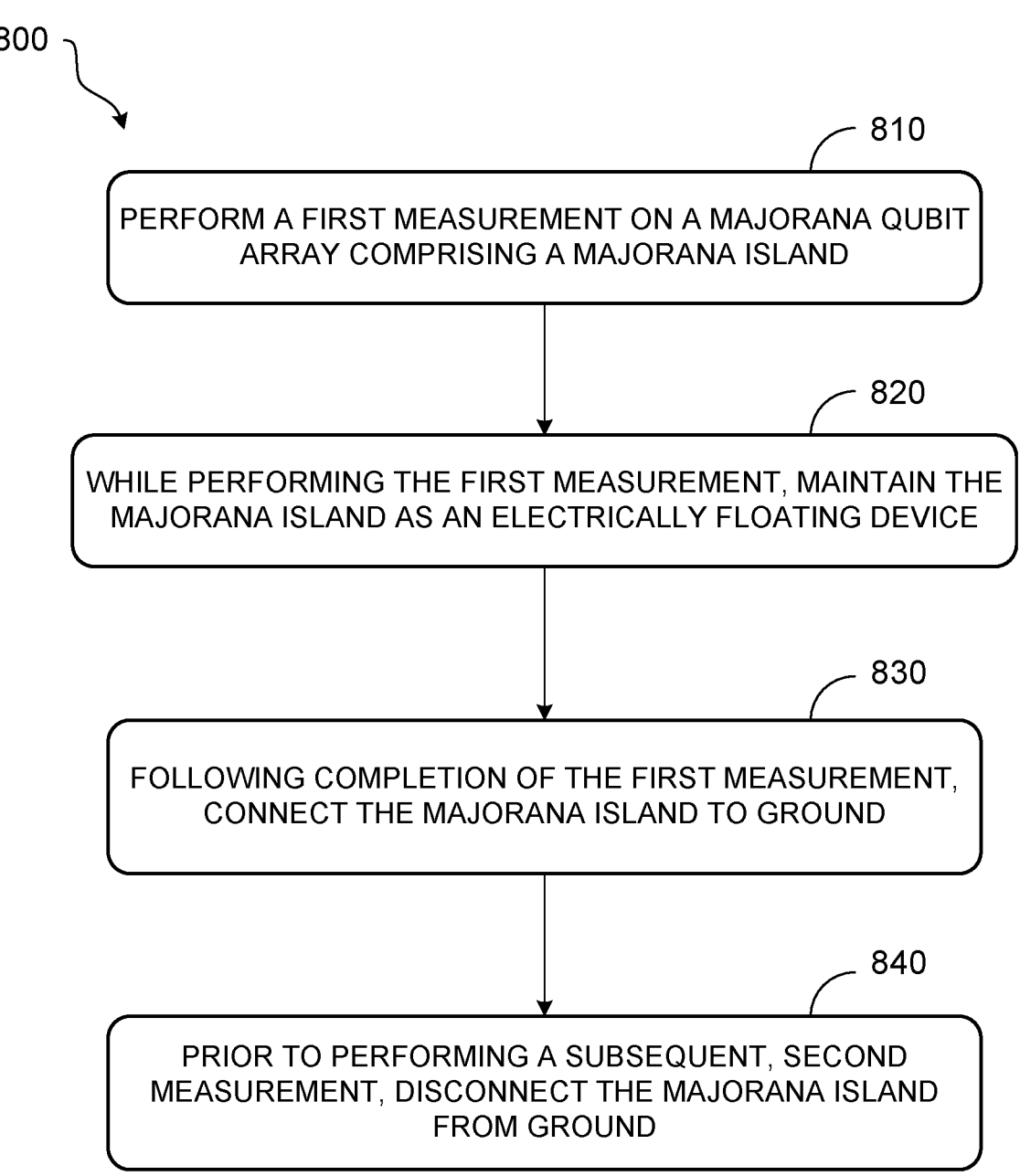

800

810

PERFORM A FIRST MEASUREMENT ON A MAJORANA QUBIT ARRAY COMPRISING A MAJORANA ISLAND

820

WHILE PERFORMING THE FIRST MEASUREMENT, MAINTAIN THE MAJORANA ISLAND AS AN ELECTRICALLY FLOATING DEVICE

830

FOLLOWING COMPLETION OF THE FIRST MEASUREMENT, CONNECT THE MAJORANA ISLAND TO GROUND

840

PRIOR TO PERFORMING A SUBSEQUENT, SECOND MEASUREMENT, DISCONNECT THE MAJORANA ISLAND FROM GROUND

FIG. 8

TUNABLE GROUND CONNECTION TO MAJORANA ZERO MODES

BACKGROUND

Majorana-based quantum computing encompasses an approach to quantum computing that utilizes topologically protected qubits (e.g., Majorana qubits) based on Majorana zero modes (MZMs). The MZMs are formed from Majorana nanowires and are instantiated at floating superconducting regions of quantum computing devices. When two or more MZMs are formed at a floating superconducting region, that superconducting region is known as a Majorana island. The parities of the MZMs included in the Majorana island may be used to store qubits and classical bits that are used for quantum computations.

SUMMARY

A computing system is presented. The computing system comprises a Majorana island at which a plurality of Majorana zero modes are instantiated, and a grounded region is tunably coupled to one of the Majorana zero modes. The grounded region comprises at least a two-dimensional electron gas (2DEG) layer. A first dielectric layer is adjacent to the 2DEG layer. A grounded gate directly contacts the 2DEG layer through a via fill.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 8 shows a flow diagram for an example method for selectively connecting a Majorana island to ground via a tunable connection.

DETAILED DESCRIPTION

Figure 1:
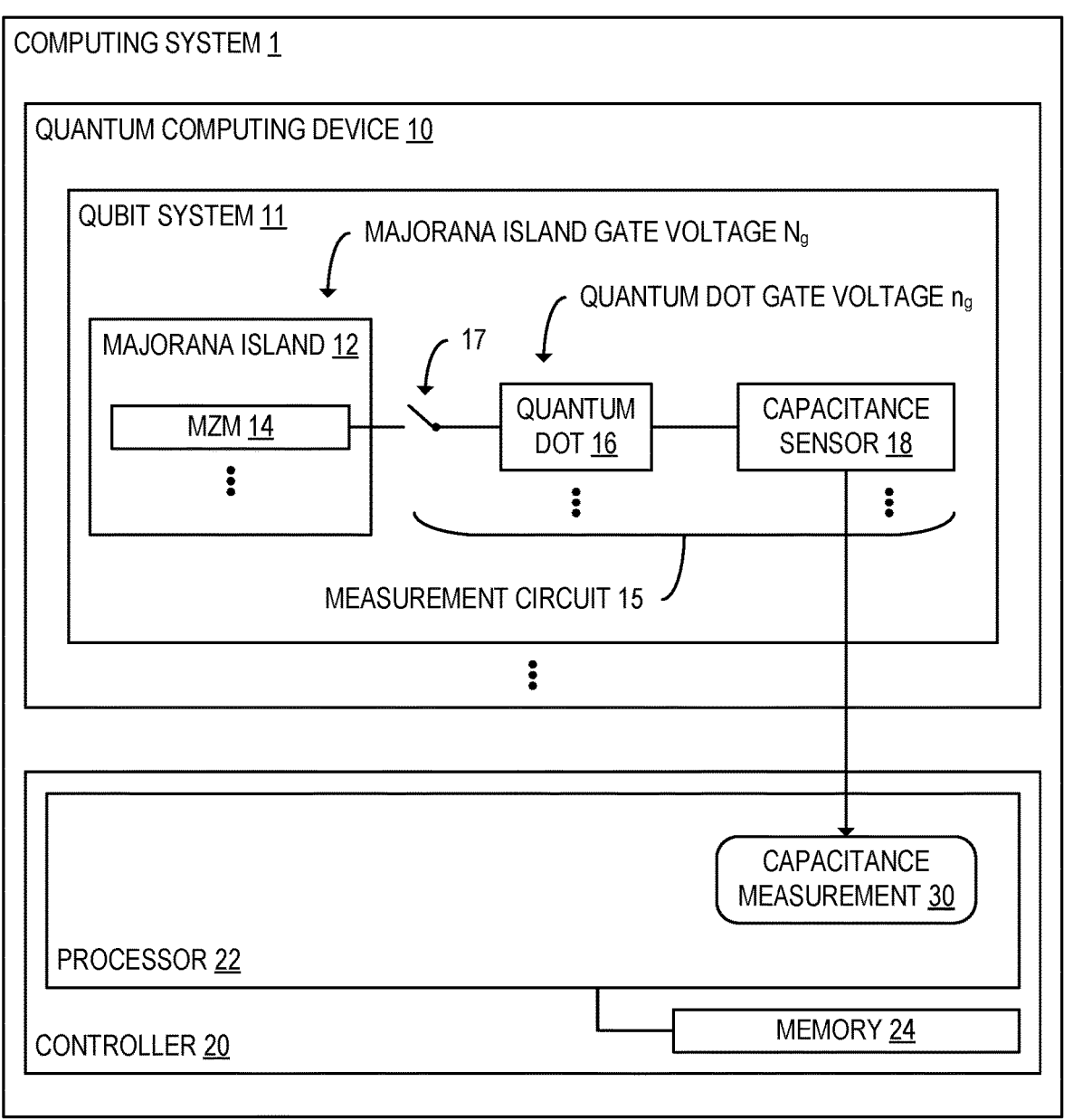
FIG. 1 schematically shows a computing system including a quantum computing device including Majorana islands and a controller.

Each Majorana island included in a Majorana-based quantum computing device may involve a Majorana nanowire with an MZM at either end. A coherent link comprises a single Majorana nanowire with two MZMs. A tetron includes four MZMs on two topological wires connected by a trivial superconducting spine. A hexon includes six MZMs on three topological wires connected by a trivial superconducting spine. Majorana nanowires are formed from components such as semiconductors and superconductors. A classical bit may be encoded at a coherent link, and a qubit may be encoded at a tetron or a hexon. Quantum information may thus be stored in the ground states of the Majorana island. Measurement-based operations may be performed on a qubit instantiated at a Majorana-based quantum computing device to perform quantum computations. The measurement-based operations may be performed by coupling pairs of MZMs included in the same or different Majorana islands using quantum dots (QDs) adjacent to the Majorana islands. These pairs of MZMs, when coupled, allow coherent single-electron transport between the MZMs of the pair.

Topological protection refers to the exponential suppression of errors as a function of the macroscopic energy ratios of a Majorana-based qubit system. Due to this exponential suppression, errors may be less likely to occur at Majorana-based qubits than at other types of qubits. However, three sources of errors are commonly seen on Majorana islands: 1) state errors from noise coupling to the residual energy splitting between MZMs; 2) addition or removal of fermions (e.g., electrons) to or from a Majorana island; and 3) intrinsic quasiparticle poisoning of the Majorana island.

Quasiparticle poisoning (QPP) is a type of error that changes the fermion parity of a Majorana island and may thereby produce errors in a quantum computation. There are three types of QPP that occur at Majorana-based quantum computing devices: intrinsic QPP, extrinsic QPP, and inter-component QPP.

Intrinsic QPP occurs when the fermion number of a Majorana island remains constant, but the ground states of the Majorana island are thermally excited above the superconducting gap A. Extrinsic QPP occurs when the Majorana island exchanges fermions with a fermion source outside the system of Majorana qubits and qubit-measurement components (QDs and coherent links). Inter-component QPP occurs when a Majorana island exchanges a fermion with another component of the qubit system, which may be another Majorana island or a QD.

Inter-component QPP can occur as a result of the decoupling procedure of a measurement. When a Majorana island is isolated, it has a fixed number of fermions. That Majorana island can be connected to other sources of fermions, such as a QD or another Majorana island. In such a scenario, during a measurement, only the fermion number of the linked system is fixed rather than the fermion number of the individual components. The process of disconnecting the Majorana island from the other linked components can thus result in a redistribution of the fermions such that the number of fermions on the Majorana island has changed compared to its pre-linked configuration. This is an embodiment of inter-component QPP. The charging energy ($E_C$) of a Majorana island can suppress the initial probability of inter-component QPP. However, once such a QPP event has occurred, the probability of that quasiparticle hopping to other Majorana islands after subsequent measurements can be quite large and approaches 1/n for an n-Majorana island measurement when the Majorana islands have the same dimensions. The reason for this phenomenon is that there is equal energy cost for the extra fermion to end up on any of the Majorana islands linked during a measurement. More generally, when there is an unbalanced distribution of fermions on the Majorana islands involved in a measurement, there will be a high probability of fermions redistributing towards a balanced state.

Herein, systems are presented for a tunable connection between Majorana islands and ground. Providing such a tunable connection may have utility, both in the bring up process for the Majorana islands (e.g., initialization and calibration of the computing device), and in mitigating errors arising from quasiparticle poisoning of Majorana islands. The described tunable connections to ground for Majorana islands provide a further advantage over other methods of grounding, both tunable and untunable, in that they couple to the Majorana island through an MZM, as opposed to the bulk of the nanowire. In this way, the grounding process is less disruptive to the encoded quantum state, which can thus be preserved. Coupling to the bulk of the nanowire in an arbitrary fashion may create errors in the quantum state. Further, the ability to couple and decouple the Majorana island to ground enables capabilities for the functioning of Majorana based devices. For example, it can be employed for bring up (e.g., initialization and calibration of the device) as well as serving a purpose in mitigating quasiparticle poisoning errors.

FIG. 1 schematically shows a computing system 1 including a quantum computing device 10 and a controller 20. The quantum computing device 10 and the controller 20 are communicatively coupled such that the controller 20 is configured to receive inputs from, and transmit output instructions to, the quantum computing device 10. The controller 20 may, for example, be a classical computing device that includes a processor 22 and memory 24, as shown in the example of FIG. 1. For example, controller 20 may be an example of the classical computing system described with regard to FIG. 9.

The quantum computing device 10 includes one or more island-dot systems 11. Each of the island-dot systems 11 includes a Majorana island 12 at which a plurality of MZMs 14 are instantiated. The Majorana island 12 may be a coherent link, a Majorana tetron, or a Majorana hexon. The island-dot system 11 further includes a measurement circuit 15, which includes a quantum dot 16 electrically connectable to an MZM 14 of the plurality of MZMs 14. The quantum dot 16 may be coupled to and decoupled from one or more MZMs 14 by closing and opening switches 17 included in the measurement circuit 15. The measurement circuit 15 further includes a capacitance sensor 18 capacitively coupled to the quantum dot 16. As discussed in further detail below, the capacitance sensor 18 is configured to transmit a plurality of capacitance measurements 30 to the controller 20. For example, the capacitance sensor 18 may be a dispersive gate sensor configured to obtain the capacitance measurement 30 via dispersive gate sensing. In other examples, some other type of capacitance sensor 18 may be included in the measurement circuit 15. For example, the capacitance sensor 18 may instead be configured to perform energy level spectroscopy or quantum dot charge sensing in other examples. The plurality of capacitance measurements 30 may be indirect measurements of a thermally averaged quantum capacitance of the Majorana island 12 and the quantum dot 16. Capacitance measurement 30 may map to a quasiparticle poisoning value when the island-dot system is configured for performing a quasiparticle detection measurement. Additionally or alternatively, capacitance measurement 30 may map to a joint MZM parity value when the island-dot system is configured to perform a joint MZM parity measurement.

By opening and closing the switch 17, the controller 20 may be configured to prevent capacitance measurements 30 from changing a qubit state of the Majorana island 12. The controller 20 may be configured to electrically couple the Majorana island 12 to the quantum dot 16 prior to performing the capacitance measurement 30. In addition, the controller 20 may be further configured to electrically decouple the Majorana island 12 from the quantum dot 16 subsequently to performing the capacitance measurement 30. Thus, the Majorana island 12 may be electrically isolated from the capacitance sensor 18 when the capacitance measurement 30 is not being performed.

Figure 2:
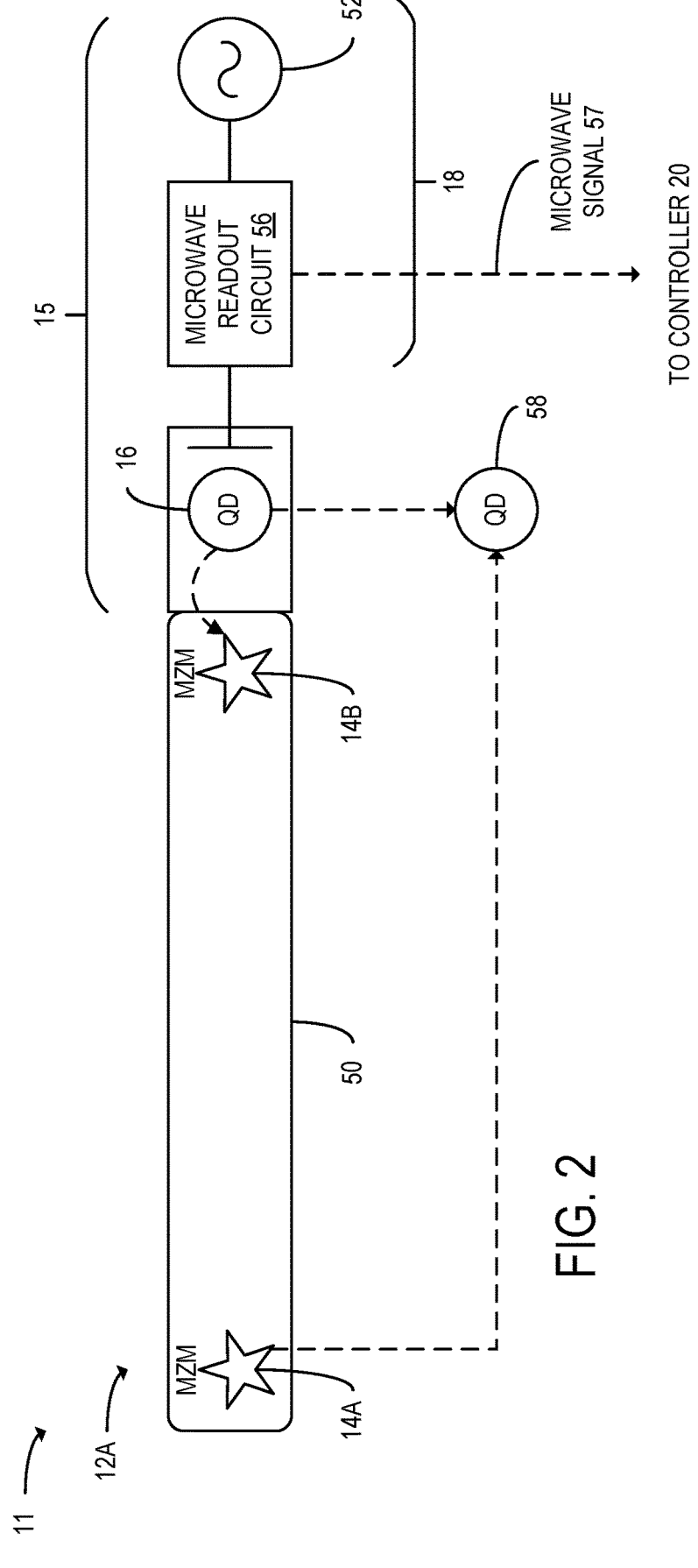
FIG. 2 shows an example configuration of the island-dot system in which the Majorana island is a coherent link, according to the example of FIG. 1.

FIG. 2 shows an example configuration of the island-dot system 11 in which the Majorana island 12 is a coherent link 12A. The coherent link 12A includes a first MZM 14A and a second MZM 14B that form at respective ends of a topological superconducting nanowire 50. In the example of FIG. 2, the QD 16 is electrically connectable to the second MZM 14B. Capacitance sensor 18 in the example of FIG. 2 can be configured to measure the coupled dot-island system by applying an alternating current (AC) voltage source 52 to QD 16.

In the example of FIG. 2, the capacitance sensor 18 includes a microwave readout circuit 56 that is electrically coupled to the AC voltage source 52 and capacitively coupled to the QD 16. The microwave readout circuit 56 is configured to generate a microwave signal based at least in part on a capacitance of the quantum dot 16 and the Majorana island 12. For example, the microwave readout circuit 56 may be an LC circuit at which the capacitance of the QD 16 and the Majorana island 12 affect a resonant frequency of the microwave readout circuit 56. Thus, a value of the capacitance may be determined from the microwave signal. The microwave signal 57, in the example of FIG. 2, is output to the controller 20 as the capacitance measurement 30.

In the example of FIG. 2, the quantum dot 16 that is used to obtain the capacitance measurements 30 is also used to perform measurements included in quantum computations. Via the quantum dot 16, the quantum computing device 10 is further configured to perform a fermion parity measurement of a plurality of MZMs 14 that includes the MZM 14B to which the quantum dot 16 is electrically coupled. Since each fermion parity measurement is of an even number of MZMs 14, the fermion parity measurement is also performed on at least one other MZM 14. The QD 16 may accordingly serve a dual purpose, thereby allowing the capacitance measurements 30 to be collected without increasing the number of QDs 16 used in the island-dot system 11. Increases in the size and manufacturing complexity of the island-dot system 11 may consequently be avoided by using the same QD 16 for capacitance measurements 30 and fermion parity measurements.

FIG. 2 further shows a fermion reservoir 58, which is an additional quantum dot in this example. As discussed in further detail below, the respective fermion numbers of the Majorana island 12 and the QD 16 may be modified by electrically coupling the Majorana island 12 and the QD 16 to the fermion reservoir 58 via one or MZMs 14. For example, the Majorana island 12 or the QD 16 may be electrically coupled to the fermion reservoir 58 during device calibration to reset its respective fermion number to zero.

Figure 3A:
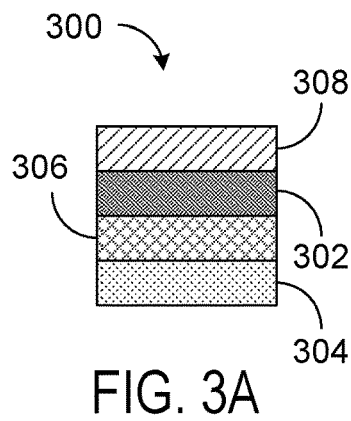
FIG. 3A illustrates a cross section of a non-grounded region of a Majorana island featuring a first layer gate.

The Majorana island comprises a nanowire positioned within a multi-layered material stack. Such a material stack may include semiconductor layers, superconductor layers, insulator layers, and metal gate layers. For example, FIG. 3A shows a cross section of a side-view of a portion of a Majorana island wherein a non-grounded region 300 comprises a material stack that features a first layer gate 302. Non-grounded region 300 can generally encompass the location surrounding the Majorana nanowire. The base layer of non-grounded region 300 is a 2-Dimensional electron gas (2DEG) layer 304. 2DEG layer 304 is a semiconductor layer to which a voltage can be applied. Upon application of a voltage, 2DEG layer 304 may accumulate electrons, thus acting as a source of electrons, and as the active area of non-grounded region 300. First dielectric layer 306 is an insulating layer (e.g., a metal oxide) that separates 2DEG layer 304 from first layer gate 302.

First layer gate 302 comprises a metal layer to which a voltage can be applied. Such an applied voltage will control whether electrons are accumulating in 2DEG layer 304 or if electrons are being depleted in 2DEG layer 304. First layer gate 302 thus effectively controls the potential of 2DEG layer 304. In this example, a second dielectric layer 308 adds another insulating layer on top of first layer gate 302. In some examples, this additional insulation allows for additional layers and/or components to be positioned on top of the first layer. Herein, generally, the "first" dielectric layer is positioned closer to the 2DEG layer (e.g., adjacent) than the "second" dielectric layer. In this example, first dielectric layer 306 and second dielectric layer 308 are designated based on first dielectric layer 306 being closer to 2DEG layer 304 than is second dielectric layer 308. In some examples, additional (third, fourth, etc.) dielectric layers may be included in non-grounded region 300. Additional layers may be assumed to be further from 2DEG layer 304 than second dielectric layer 308. In such examples, second dielectric layer 308 may not be the furthest dielectric layer from 2DEG layer 304 but will still be positioned further away from 2DEG layer 304 when compared to the first dielectric layer 306.

Figure 3B:
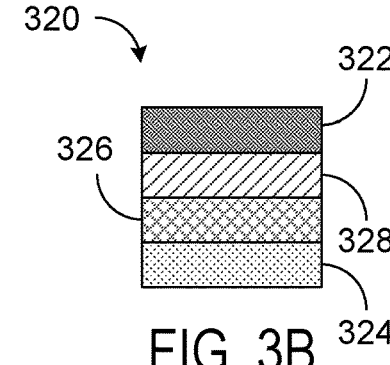
FIG. 3B illustrates a cross section of a non-grounded region of a Majorana island featuring a second layer gate.

Some non-grounded regions of Majorana islands comprise a second layer gate, in addition to or as an alternative to a first layer gate. FIG. 3B illustrates a cross section of a side-view of portion of a Majorana island wherein a non-grounded region 320 of a material stack features a second layer gate 322. Similarly to non-grounded region 300, non-grounded region 320 comprises a 2DEG layer 324 where electrons may be accumulated.

On top of 2DEG layer 324 is a first dielectric layer 326. Throughout the Majorana island device, the 2DEG layer can be grown on a substrate. The first dielectric layer 326 can be deposited on top of 2DEG layer 324. A second dielectric layer 328 (a same or different insulating material as first dielectric layer 326) is on top of first dielectric layer 326. Second layer gate 322 is positioned on top of second dielectric layer 328. Non-grounded region 320 is thus controlled by whether a positive or negative voltage is applied to second layer gate 322. Such a voltage controls the density of electrons in 2DEG layer 324.

Figure 3C:
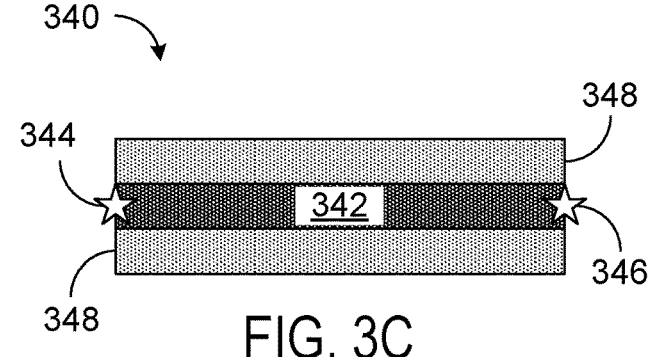
FIG. 3C illustrates a non-grounded region of a Majorana island featuring a nanowire.

In the examples of a first layer gate, a topological superconductor may be placed thereunder, positioned between the first dielectric and the 2DEG region. FIG. 3C shows a top-down view of non-grounded region 340. The nanowire itself is positioned within region 342. Stars at either end of region 342 indicate the position of Majorana zero modes 344 and 346. First layer gate 348 is positioned above region 342 and the nanowire. First layer gate 348 can have a broader extent, or a wider extent than the nanowire itself.

Figure 3D:
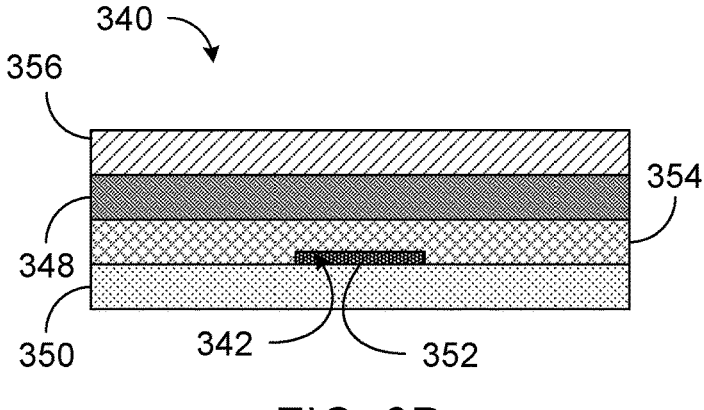
FIG. 3D illustrates a side view of the non-grounded region of FIG. 3C.

FIG. 3D shows a side view of non-grounded region 340 of FIG. 3C, including region 342. 2DEG layer 350 is the base layer of the material stack of non-grounded region 340. Along the length of region 342 there is a superconductor 352 that is positioned directly on top of 2DEG layer 350 in a select region to generate the nanowire. First dielectric layer 354 is deposited on top of 2DEG layer 350 and superconductor 352. First layer gate 348 is stacked on top of first dielectric layer 354, and second dielectric layer 356 is deposited on top of first layer gate 348. In some examples, second dielectric layer 356 may be omitted.

As described herein, mitigating quasiparticle poisoning represents a challenge in quantum computing. Herein, systems are presented that physically modify the Majorana islands so that any quasiparticles that have poisoned the superconductor are allowed to relax off of the superconductor. This approach is referred to herein as a tunable connection between the Majorana islands and ground. A region of the 2DEG layer is selectively connected to ground, and thus the coupling of the Majorana islands to ground can be selectively turned on or turned off, such as being turned off when capacitive measurements are being performed, then turned on when capacitive measurements are not being performed.

As described, if intercomponent quasiparticle poisoning is left unchecked, two-qubit measurements can spread quasiparticles throughout a Majorana-based qubit array with high probability. One benefit of having a tunable connection between Majorana islands and ground is that the Majorana islands can be floated (e.g., not grounded) during measurements. The Majorana islands can then be connected to ground between measurements. Advantageously, if the Majorana island is connected to ground through a single Majorana zero mode, then this process does not read out the qubit state. Thus, if Majorana islands are quasiparticle-poisoned during measurements, these quasiparticles can relax off the Majorana island with high probability when connected to ground without measuring the qubit. Allowing quasiparticles to relax off the Majorana islands after measurement reduces the probability that subsequent multi-Majorana island measurements will spread quasiparticles throughout the system.

An additional benefit of Majorana islands having a tunable connection to ground is for simplifying the tuning and/or calibration process of a large Majorana qubit array.

Without a ground connection, charge can only be shuffled between different islands, and the total charge of the qubit array cannot be changed. However, the charge values of the islands corresponding to the ground state are determined by the plunger gate voltages. The plunger gate thus controls the density of electrons for an associated quantum dot. Combining these constraints can complicate or even obstruct the ability of the islands to be tuned into the topological phase, which only exists for a certain range of voltages. Incorporating tunable ground connections, without sacrificing the connectivity of the qubit array, allows for the Majorana islands to relax with high probability to their charge ground state for a given plunger gate voltage.

As follows, a tunable ground connection can be implemented in a system with Majorana islands formed by depositing superconductor and electrostatic gates on a semiconductor 2DEG layer. Providing a tunable ground connection to a Majorana island generates a local 2DEG layer with a direct connection to ground. This region can be surrounded by a 2DEG layer that can be tuned to either accumulate electrons or deplete electrons to allow a connection between the grounded region and adjacent elements.

Figure 4A:
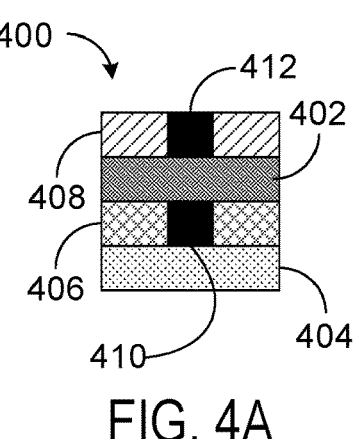
FIG. 4A illustrates a grounded region having a first layer gate.
Figure 4B:
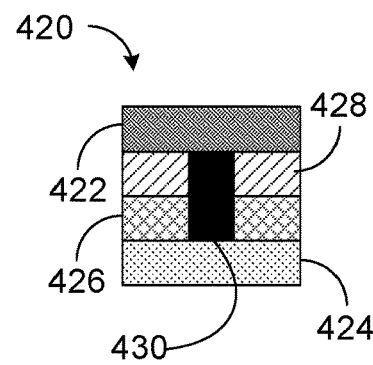
FIG. 4B illustrates a grounded region having a second layer gate.

FIGS. 4A and 4B comprise somewhat similar structures to FIGS. 3A and 3B. FIG. 4A shows a structure with a first layer gate, while FIG. 4B shows a structure with a second layer gate. FIG. 4A shows a cross section of a side-view of a portion of a grounded region 400 that comprises a material stack featuring a first layer gate 402. The base layer is a 2DEG layer 404. 2DEG layer 404 is a semiconductor layer to which a voltage can be applied. First dielectric layer 406 is positioned between 2DEG layer 404 and first layer gate 402. First layer gate 402 is a grounded gate, comprising a metal layer to which a voltage can be applied, thus controlling the potential of 2DEG layer 404. First layer gate 402 is separated from 2DEG layer 404 except where directly contacting 2DEG layer 404 using a via fill 410 through first dielectric layer 406, which otherwise separates first layer gate 402 from 2DEG layer 404. A second dielectric layer 408 adds another insulating layer on top of first layer gate 402. In this example, first layer gate 402 is positioned between first dielectric layer 406 and second dielectric layer 408. The via fill, as shown, includes via fill 410, that extends between 2DEG layer 404 and first dielectric layer 406. A second via fill 412 extends from first layer gate 402 through second dielectric layer 408.

As an example, first dielectric layer 406 can be deposited on 2DEG layer 404. A hole may be etched through first dielectric layer 406, followed by deposition of metal in the hole to generate via fill 410. This provides a direct electrical connection between 2DEG layer 404 and first layer gate 402. The second dielectric layer 408 can be deposited, etched, and filled, and second via fill 412 generated. Metal is used to fill the etchings in via fill 410 and second via fill 412, allowing for routing of first layer gate 402 out to a ground connection from the top of the device. Additionally or alternatively, first layer gate 402 can be directly connected to ground through in-plane routing in the same layer as first layer gate 402 itself. Grounded region 400 can be separated from adjacent components using cutter gates and depletion gates.

Alternatively, a gate may be positioned in the second layer, as illustrated in FIG. 4B. FIG. 4B shows a cross section of a side-view of a portion of a grounded region 420 that comprises a material stack featuring second layer gate 422. The base layer is a 2DEG layer 424. First dielectric layer 426 is positioned on top of 2DEG layer 424. A second dielectric layer 428 is positioned on top of first dielectric layer 426. Second layer gate 422 is positioned on top of second dielectric layer 428. A via fill 430 is generated through first dielectric layer 426 and second dielectric layer 428, allowing for a direct connection between second layer gate 422 and 2DEG layer 424.

In manufacturing, first dielectric layer 426 is deposited everywhere on 2DEG layer 424, and second dielectric layer 428 is deposited everywhere on first dielectric layer 426. A hole is etched through both dielectric layers to generate via fill 430. Second layer gate 422 directly contacts 2DEG layer 424 through the metal in via fill 430. Numerous types of via etching processes can be used to generate the via for via fill 430.

For either grounded region 400 or grounded region 420, when the 2DEG layer is under a gate connected to ground, the gate will be at 0V. When the material stack is configured such that the 2DEG layer accumulates electrons (e.g., has a finite density of electrons) at 0V, then gates 402 and 422 can be used to geometrically define their respective grounded region. However, these properties may not necessarily hold for different materials.

Figure 4C:
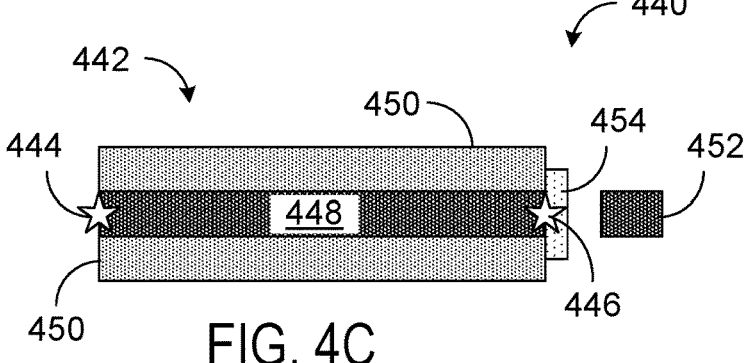
FIG. 4C illustrates a Majorana island coupled to a grounded region via a cutter gate.
Figure 4D:
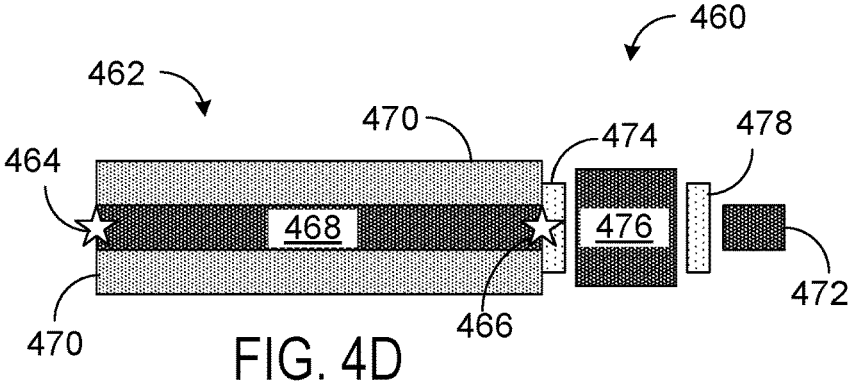
FIG. 4D illustrates a Majorana island coupled to a grounded region via cutter gates and a plunger gate.

Majorana islands can be tunably connected to ground either through a cutter gate, or with a quantum dot, or with series of quantum dots and cutter gates in between the grounded region and the Majorana island. Such a tunable ground connection design is shown in FIGS. 4C and 4D. Grounded regions are compatible with a tunable ground configuration that is separated from the Majorana island by a cutter gate or through a combination of cutter gates and plunger gates.

FIG. 4C shows a system 440 for a Majorana island 442 at which two MZMs (444, 446) are instantiated. MZMs 444 and 446 are at the endpoints of the Majorana nanowire 448. Nanowire 448 is positioned within material stack 450. A grounded region 452 is indirectly coupled to MZM 446 via a cutter gate 454. Other examples may include multiple cutter gates. Grounded region 452 may be an example of either grounded region 400 (e.g., first layer stack) or grounded region 420 (e.g., second layer stack). When the cutter gate 454 is opened, there is a coupling between grounded region 452 and the adjacent components of Majorana island 442. When this type of ground connection is called upon, grounded region 452 will comprise electrons that are coupled to ground. Separation from the MZM 446 by cutter gate 454 and/or other components allows the grounding to be tunable.

Similarly, FIG. 4D shows a system 460 for a Majorana island 462 at which two MZMs (464, 466) are instantiated. MZMs 464 and 466 are the endpoints of nanowire 468. Nanowire 468 is positioned within material stack 470.

Grounded region 472 is indirectly coupled to MZM 466. In this example, grounded region 472 is indirectly coupled to MZM 466 via a first cutter gate 474, a QD plunger gate 476, and a second cutter gate 478. As described with regard to FIG. 4C, QD plunger gate 476 and cutter gates 474 and 478 serve to separate grounded region 472 from MZM 466, and to tune the coupling between grounded region 472 and MZM 466.

Figure 5A:
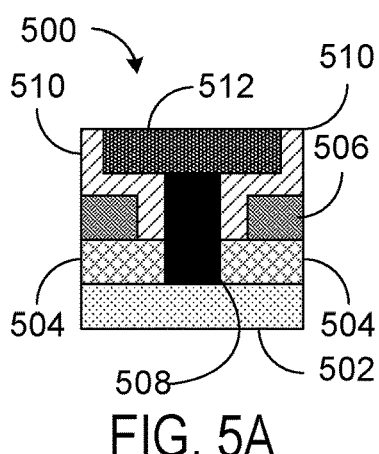
FIG. 5A illustrates a grounded region having a first layer gate and a second layer gate.

Another example of a grounded region is illustrated in FIG. 5A. FIG. 5A shows a cross section of a side-view of portion of a grounded region 500 that comprises a material stack. The base layer is a 2DEG layer 502. First dielectric layer 504 is positioned on top of 2DEG layer 502. First layer gate 506 surrounds, but does not directly contact via fill 508. First layer gate 506 can be used to accumulate or deplete 2DEG layer 502 where 2DEG layer 502 is contacted by via fill 508. A second dielectric layer 510 is positioned above first layer gate 506. Second dielectric layer 510 can fill in holes in first layer gate 506 and may thus contact portions of first dielectric layer 504. A second layer gate 512 is a grounded gate that may be positioned on top of second dielectric layer 510. In some examples, second layer gate 512 may be positioned further from 2DEG layer 502, such as in a third or fourth dielectric layer. Second layer gate 512 may be a grounded gate that is separated from 2DEG layer 502 by first dielectric layer 504 and second dielectric layer 510, except where second layer gate 512 directly contacts 2DEG layer 502 through via fill 508, which extends from 2DEG layer 502 to second layer gate 512.

First dielectric layer 504 can be deposited across the whole of 2DEG layer 502. First layer gate 506 may be deposited on top of first dielectric layer 504 as shown in FIG. 5A, with one or more gaps within the gate (e.g., a hole in the center of first layer gate 506). Depositing second dielectric layer 510 onto first layer gate 506 fills the gaps. Second dielectric layer 510 and first dielectric layer 504 can be etched, generating the hole where via fill 508 is generated. The etched hole may be filled to form via fill 508, and second layer gate 512 can be positioned on top of second dielectric layer 510. The same dielectric material used in second dielectric layer 510 may be used to fill any gaps around second layer gate 512. Second layer gate 512 may be directly connected to ground, either through a second via for vertical routing, or through in-plane routing in the same gate layer.

First layer gate 506 is not electrically connected to ground, to via fill 508, or to second layer gate 512. Rather, first layer gate 506 is encompassed in dielectric material. However, some positive voltage can be applied to first layer gate 506. First layer gate 506 can thus be tuned to accumulate electrons or deplete electrons in the portions of 2DEG layer 502 positioned directly underneath responsive to a positive change in applied voltage or a negative change in applied voltage, respectively, as compared to the depletion voltage of the 2DEG layer. When 2DEG layer 502 is accumulating (e.g., by applying a positive voltage to first layer gate 506), first layer gate 506 defines a grounded region in the portion of 2DEG layer 502 underneath it. When 2DEG layer 502 is depleted (e.g., by applying a negative voltage to first layer gate 506), first layer gate 506 separates the ground connection from any adjacent components. Although there is a direct electrical connection between second layer gate 512 and 2DEG layer 502, there are no electrons present, and grounded region 500 is not actually grounded. In this way, instead of relying solely on the fact that 2DEG layer 502 is accumulating electrons at 0 volts, this acknowledges the possibility that at 0 voltage there might not be electrons. Rather, a positive voltage can be applied to drive electrons into the 2DEG region 502. This provides tunability to grounded region 500.

Figure 5B:
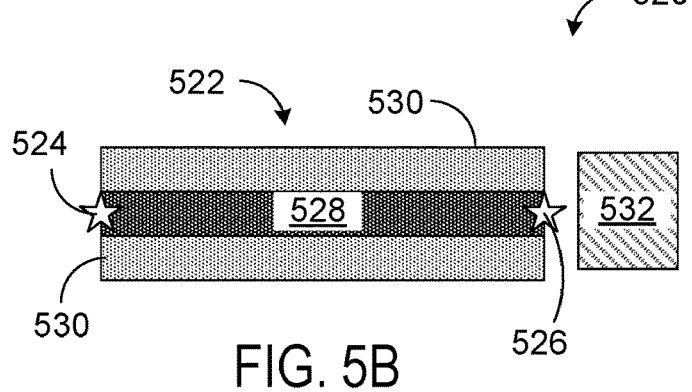
FIG. 5B illustrates a Majorana island operatively coupled to a grounded region.
Figure 5C:
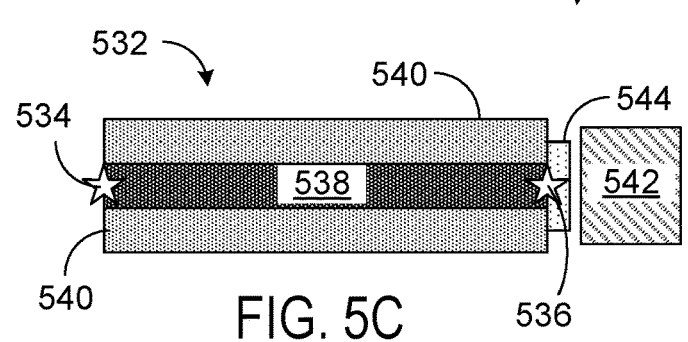
FIG. 5C illustrates a Majorana island indirectly coupled to a grounded region via a cutter gate.
Figure 5D:
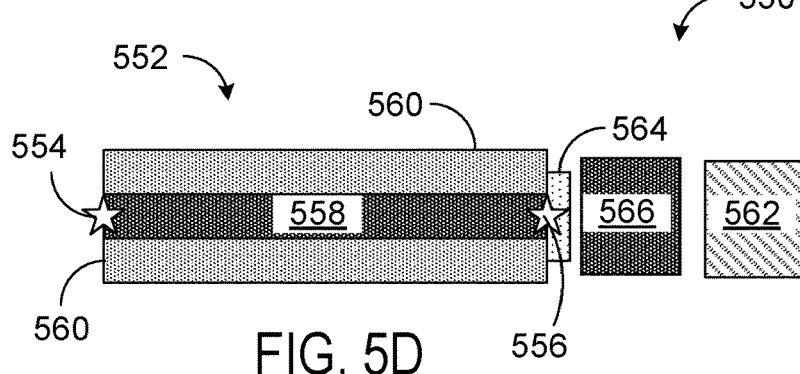
FIG. 5D illustrates a Majorana island indirectly coupled to a grounded region via a cutter gate and a plunger gate.

FIGS. 5B-5D show Majorana islands tunably coupled to grounded regions in differing mechanisms. FIG. 5B shows a system 520 for a Majorana island 522 at which two MZMs (524, 526) are instantiated. Nanowire 528 comprises MZMs 524 and 526. Nanowire 528 is positioned within material stack 530. Grounded region 532 may be an example of grounded region 500. Grounded region 532 is shown operatively adjacent to MZM 526. As the tunability of the ground connection is directly controlled by the first layer gate within grounded region 532, a direct connection can be made to Majorana island 522 without constant grounding of MZMs 524 and 526.

FIG. 5C shows a system 530 for a Majorana island 532 at which two MZMs (534, 536) are instantiated. Nanowire 538 has MZMs 532 and 536. Nanowire 538 is positioned within material stack 540. Grounded region 542 may be an example of grounded region 500. Grounded region 542 is shown indirectly coupled to MZM 536 via cutter gate 544. This provides additional layers of control and isolation over electron flow through Majorana island 532.

FIG. 5D shows a system 550 for a Majorana island 552 at which two MZMs (554, 556) are instantiated. Nanowire 558 comprises MZMs 554 and 556. Nanowire 558 is positioned within material stack 560. Grounded region 562 may be an example of grounded region 500. Grounded region 562 is shown indirectly coupled to MZM 556 via cutter gate 564 and QD plunger gate 566, again allowing for additional control and selected isolation over electron flow through Majorana island 552

FIGS. 6A-6D illustrate different ways that these tunable connections to the ground could be incorporated into devices that have Majorana islands such as tetrons and hexons, and where the grounded region is tunably connected to two or more MZMs, either directly or indirectly.

Figure 6A:
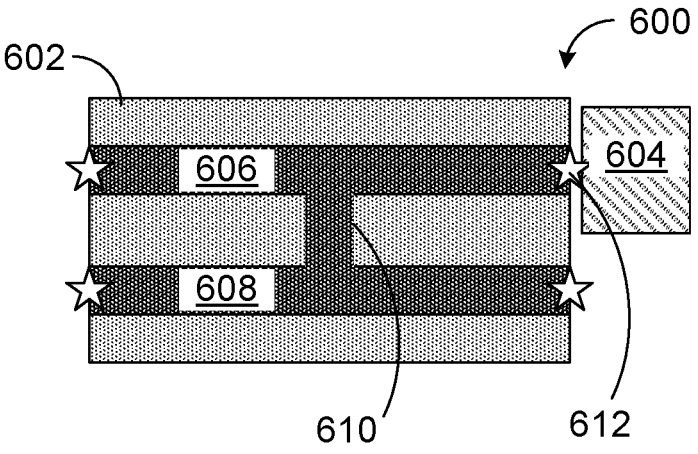
FIG. 6A illustrates a tetron operatively coupled to a grounded region via an MZM.

FIG. 6A shows a system 600 comprising a Majorana island 602 and a grounded region 604. Majorana island 602 is configured as a tetron, with two topological wires (606 and 608) connected by a non-topological superconductor 610. Each topological wire includes two MZMs (stars). In this example, grounded region 604 is operatively adjacent to MZM 612 of topological wire 606. The positioning of grounded region 604 to a single MZM allows preservation of quantum information throughout Majorana island 602, which is always in pairs of MZMs. This allows quasiparticles to relax off of Majorana island 602 without affecting any stored quantum information.

Figure 6B:
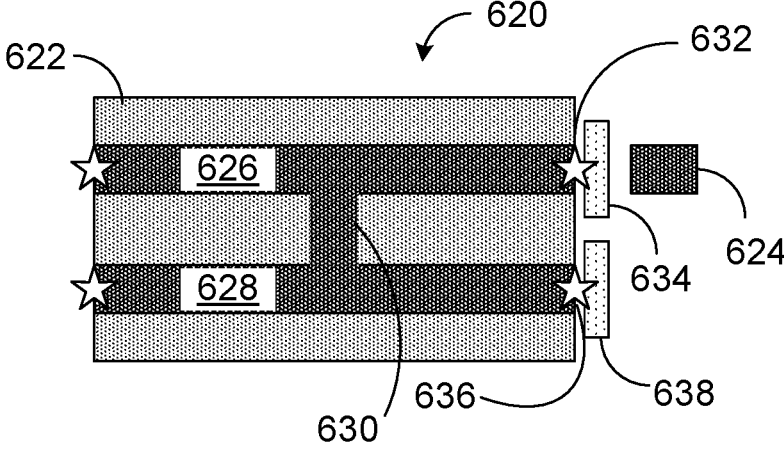
FIG. 6B illustrates a tetron indirectly coupled to a grounded region via cutter gates.

FIG. 6B shows a system 620 comprising a Majorana island 622 and a grounded region 624. Majorana island 622 is configured as a tetron, with two topological wires (626 and 628) connected by a non-topological superconductor 630. Each topological wire includes two MZMs (stars). In this example, grounded region 624 is indirectly coupled to MZM 632 on topological wire 626 via cutter gate 634. MZM 636 is also regulated by cutter gate 638. Herein, quasiparticles can relax off of Majorana island 622 either through MZM 632 and cutter gate 634, or through MZM 636 and cutter gate 638. However, it is preferable to only couple grounded region 624 to one MZM to not disturb the quantum information.

Figure 6C:
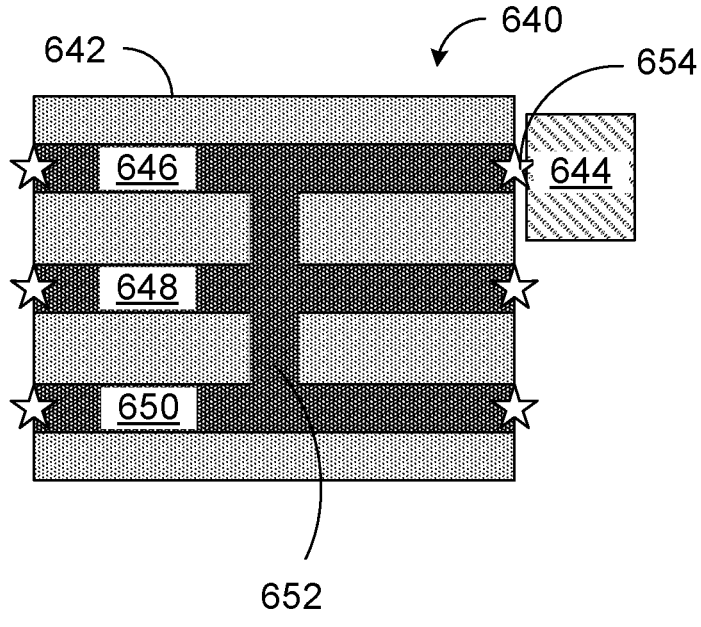
FIG. 6C illustrates a hexon operatively coupled to a grounded region via an MZM.

FIG. 6C shows a system 640 comprising a Majorana island 642 and a grounded region 644. Majorana island 642 is configured as a hexon, with three topological wires (646, 648, and 650) connected by a non-topological superconductor 652. Each topological wire includes two MZMs (stars). In this example, grounded region 644 is operatively coupled to MZM 654 on topological wire 646.

Figure 6D:
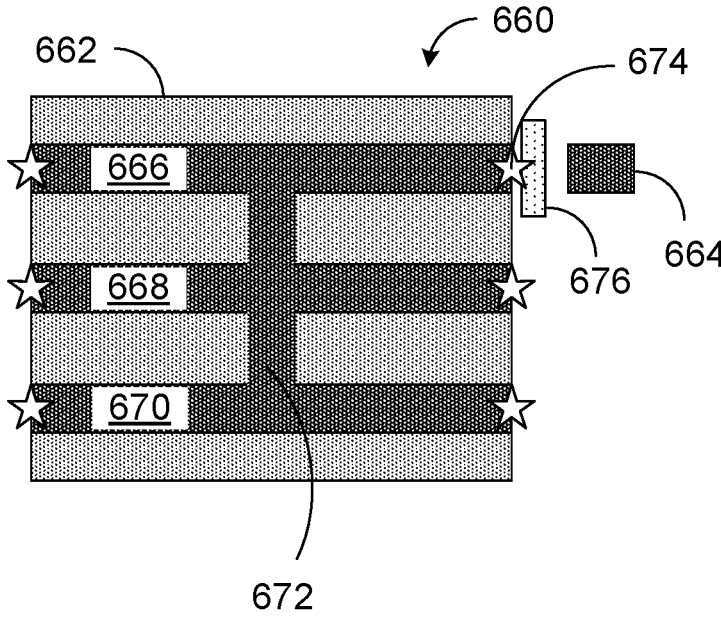
FIG. 6D illustrates a hexon indirectly coupled to a grounded region via a cutter gate.

FIG. 6D shows a system 660 comprising a Majorana island 662 and a grounded region 664. Majorana island 662 is configured as a hexon, with three topological wires (666, 668, and 670) connected by a non-topological superconductor 672. Each topological wire includes two MZMs (stars). In this example, grounded region 664 is indirectly coupled to MZM 674 on topological wire 666 via cutter gate 676.

Figures 7A, 7B:
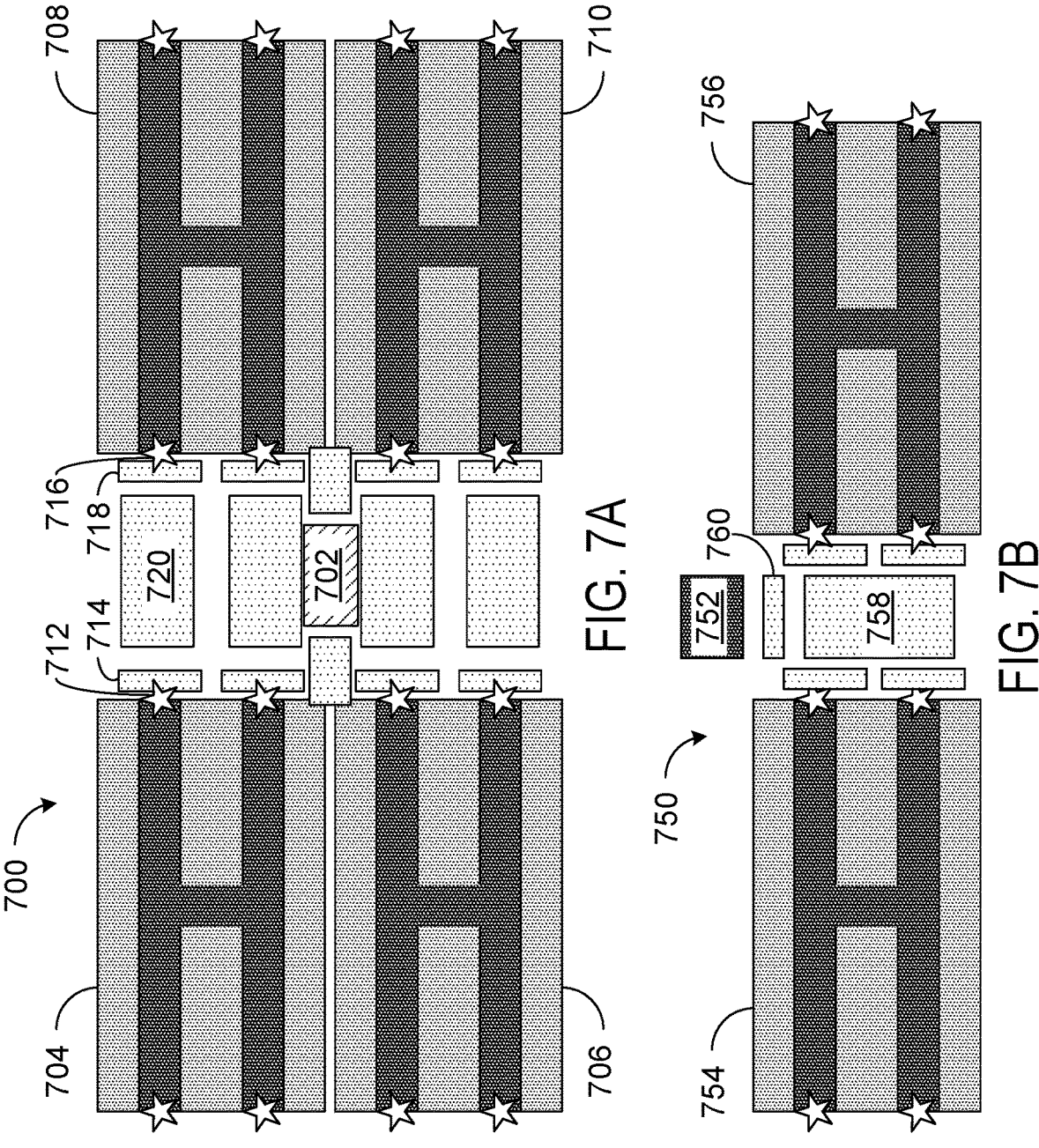
FIG. 7A illustrates a system where four tetrons are linked to a grounded region via a series of cutter gates and plunger gates.
FIG. 7B illustrates a system where two tetrons are linked to a grounded region via a series of cutter gates and a plunger gate.

In some examples, grounded regions can be shared by two or more Majorana islands, and may be connected to MZMs of two or more Majorana islands. FIG. 7A shows an example system 700 where a grounded region 702 is coupled to four tetrons (704, 706, 708, 710), each with four MZMs. Each MZM is positioned adjacent to a cutter gate. Neighboring cutter gates share a QD plunger gate. For example, MZM 712 is adjacent to cutter gate 714 and MZM 716 is adjacent to cutter gate 718. Cutter gates 714 and 718 are both adjacent to QD plunger gate 720.

Grounded region 702 is positioned at the center of system 700 so as to be able to ground any of tetrons 704, 706, 708, and 710. In some examples, some quantum dots may be selected to be accumulating and certain cutter gates could be selected to be accumulating. Such a network of cutter gates and plunger gates, allows for individual control over the tunable ground to each of the different tetrons separately. There is no physics-based limit to how many islands could operate on a single gate control, but spacing practicalities may constrain that number. However, longer distance tunable connections could be made to further away Majorana islands.

In another example, FIG. 7B shows an example system 750 where a grounded region 752 is coupled to two tetrons (754, 756), each with four MZMs. Each MZM is positioned adjacent to a cutter gate. Each cutter gate shares a QD plunger gate 758. An additional cutter gate 760 is positioned between QD plunger gate 758 and grounded region 752. Grounded region 752 may be separated from other components of system 750 by some type of gate. By including cutter gate 760, QD plunger gate 758 is not always grounded. QD plunger gate 758 and each MZM may be selectively connected to grounded region 752, or may be separated by cutter gate 760.

An operational feature of implementing a tunable connection to ground is determining when the Majorana island is to be connected to ground, and then turning on the connection, either directly or through various cutter gates and quantum dot plunger gates. When the Majorana island is to be floating, the connection to ground is turned off through depletion under the cutter gates or under the tunable ground for the first layer gate.

FIG. 8 shows a flow diagram for an example method 800 for selectively connecting a Majorana island to ground via a tunable connection to ground, such as the systems shown in FIGS. 4A-4D, 5A-5D, 6A-6D, and 7A-7D. Method 800 may be carried out by a controller, such as controller 20, described with regard to FIG. 1.

At 810, method 800 comprises performing a first measurement on a Majorana qubit array comprising a Majorana island. For example, the first measurement may be a capacitance measurement or a fermion parity measurement.

At 820, method 800 comprises, while performing the first measurement, maintaining the Majorana island as an electrically floating device. In other words, the Majorana island is not connected to ground. During operations and measurements, the Majorana island is maintained as floating, or separate from any of the potential ground connections. Such measurements may involve multiple Majorana islands at a time. It is possible that in the transition from the initial configuration of electrons, performing the measurement, and disconnecting the measurement, electrons are rearranged so that there are a different number of electrons on one or more of the Majorana islands than what was there initially (e.g., inter-component quasiparticle poisoning). These additional electrons can result in an error to the qubit.

At 830, method 800 comprises, following completion of the first measurement, connecting the Majorana island to ground. For repeated measurements and grounding, the grounding connection may be performed at a predetermined frequency or, when the likelihood of the Majorana island being poisoned to a certain degree increases above a threshold.

Following a measurement where it is suspected that quasiparticle poisoning may have occurred or it is known to have occurred based on a measurement, that Majorana island can be connected through a single MZM to ground. When the Majorana island is in a poisoned state and has an extra electron, it will be in a higher energy state. If the Majorana island is connected to ground when it is in a higher energy state, it will, with high probability, relax back to its ground state, which will be the initial number of electrons on that Majorana island.

There is a small probability that the grounded Majorana island was not in a poisoned state, that it was already in the ground state, and thus connecting it to ground will excite it into an excited state. But generally by grounding the Majorana island between measurements, the system can be returned to thermal equilibrium, where most of the Majorana islands are in their ground state.

Grounding the Majorana island at each potential moment comes with a number of costs. Connecting a Majorana island to ground does take a finite amount of time, the duration of which depends on how strong the coupling is to the ground, what the temperature of the system is, what the charging energy is of the Majorana island is, and how highly excited it is in the poisoned state. This time cost is in addition to any control cost of adding extra control pulses to tell you when to connect to ground and when to disconnect from ground. There are also fabrication costs of creating this tunable connection to ground regions including etching and filling each via fill. Further, there exists the possibility that the Majorana island was not in a poisoned state before being connected to ground and is now excited after performing the ground connection. All of those are costs that have to be balanced when choosing how often to connect to ground.

In some examples, each Majorana island is connected to ground following any measurement, because anytime a measurement is performed, there is an increased possibility of each Majorana island becoming poisoned. Additionally or alternatively, after each measurement, a quasiparticle poisoning detection measurement can be performed. Then, based on the results of that detection measurement, a decision is made whether to connect each island to ground.

In some examples, the Majorana islands can be connected to ground, after a pre-determined number of measurements, or after any measurement that uses a threshold number of Majorana islands. Different criteria could govern the frequency based on operating conditions. Criteria could be selected based on experience. The system may learn over time a certain number of measurement cycles (e.g., 3) provides an optimal opportunity to ground the Majorana island.

The system would undergo some initial characterization, allowing for a prediction as to how often a poisoned Majorana island state will occur based on the process of coupling and decoupling from measurements. Such a frequency may also be based on the charging energies of the Majorana islands and associated quantum dots. For a given application, there will be a tolerance for a quasiparticle poisoning error. The Majorana island may thus be grounded at a rate that is higher than that tolerance.

Returning to FIG. 8, at 840, method 800 comprises, prior to performing a subsequent, second measurement, disconnecting the Majorana island from ground. In this way, the Majorana island is floating during measurements, and grounded in between measurements, thus preserving quantum information.

In some examples, the first measurement and second measurement are multi-Majorana island measurements. The first measurement and second measurement may be the same type of measurement or different types of measurement.

While there have been other attempts at implementing a tunable connection, it is not obvious that such an implementation would have substantive utility. Tunable ground connections represent a challenging concept to implement that adds complexity to the system. Quasiparticle poisoning is a recently recognized problem, and it is not obvious that implementing a tunable connection would be helpful in mitigating quasiparticle poisoning rather than making the problem worse.

There are considerable technical effects realized by implementing the disclosed systems and methods. Having Majorana islands that are always grounded generates a lot of problems in using them to create a quantum computer. Having the ability to choose when the Majorana islands are coupled or decoupled to ground avoids these problems. Previous attempts at a tunable connections to ground needed a very strong connection to ground, e.g., running a current from the Majorana island to ground. Such systems are challenging to implement and have generally been unsuccessful.

For the systems described herein, weaker coupling, e.g., a tunnel coupling to ground, rather than a transport connection is sufficient. An established path for quasiparticles to relax off of the Majorana island and go to ground means that electrons only need to be able to traverse a few elements. This can be a much weaker coupling, or a tunnel coupling to ground rather than a transport connection.

Further, the disclosed systems not only couple the Majorana island to ground but do so via one of the MZMs. This reduces the disruption to the encoded quantum state, so the quantum state can be preserved while grounding the Majorana island. In contrast, by coupling the grounded layer arbitrarily to a position on the nanowire, new errors could be created in the quantum state.

In some embodiments, the methods and processes described herein may be tied to a classical computing system of one or more computing devices. In particular, such methods and processes may be implemented as a computer-application program or service, an application-programming interface (API), a library, and/or other computer-program product.

Figure 9:
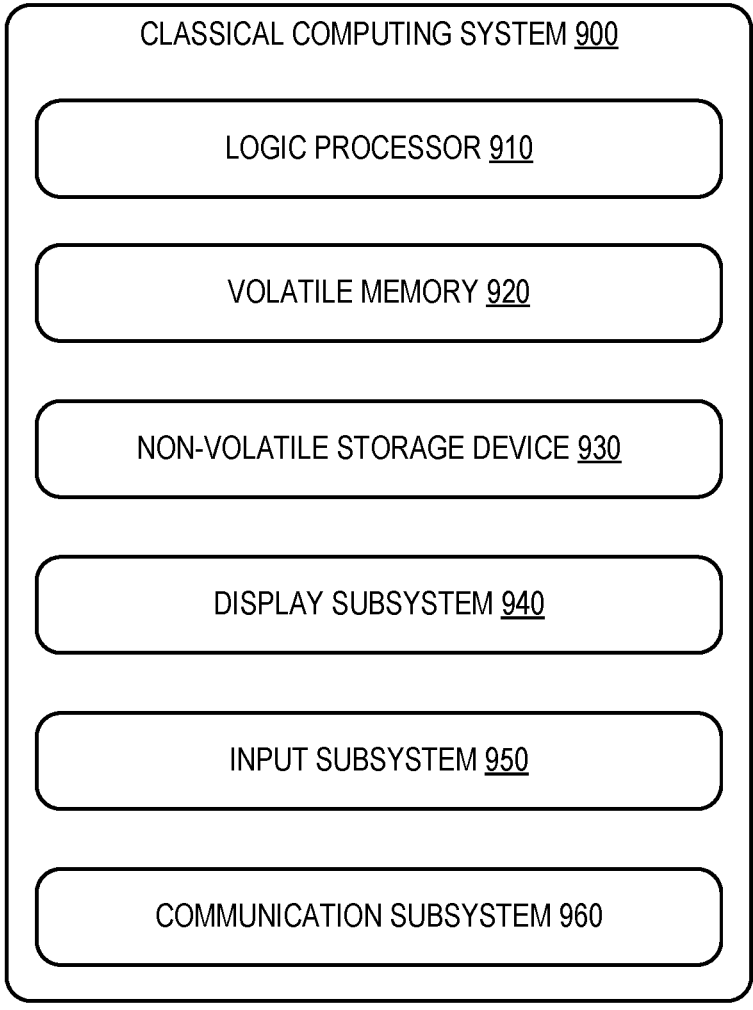
FIG. 9 shows a schematic view of an example classical computing system.

FIG. 9 schematically shows a non-limiting embodiment of a classical computing system 900 that can enact one or more of the methods and processes described above. Classical computing system 900 is shown in simplified form. Classical computing system 900 may embody classical computing aspects of computing system 1 as described above and illustrated in FIG. 1, such as controller 20. Classical computing system 900 may take the form of one or more personal computers, server computers, tablet computers, home-entertainment computers, network computing devices, gaming devices, mobile computing devices, mobile communication devices (e.g., smart phone), and/or other computing devices, and wearable computing devices such as smart wristwatches and head mounted augmented reality devices. Classical computing system 900 may be operatively coupled to one or more quantum computing devices, such as quantum computing device 10 as described above and illustrated in FIG. 1.

Classical computing system 900 includes a logic processor 910 volatile memory 920, and a non-volatile storage device 930. Classical computing system 900 may optionally include a display subsystem 940, input subsystem 950, communication subsystem 960, and/or other components not shown in FIG. 9.

Logic processor 910 includes one or more physical devices configured to execute instructions. For example, the logic processor may be configured to execute instructions that are part of one or more applications, programs, routines, libraries, objects, components, data structures, or other logical constructs. Such instructions may be implemented to perform a task, implement a data type, transform the state of one or more components, achieve a technical effect, or otherwise arrive at a desired result.

The logic processor may include one or more physical processors (hardware) configured to execute software instructions. Additionally or alternatively, the logic processor may include one or more hardware logic circuits or firmware devices configured to execute hardware-implemented logic or firmware instructions. Processors of the logic processor 910 may be single-core or multi-core, and the instructions executed thereon may be configured for sequential, parallel, and/or distributed processing. Individual components of the logic processor may optionally be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects are run on different physical logic processors of machines, it will be understood.

Non-volatile storage device 930 includes one or more physical devices configured to hold instructions executable by the logic processors to implement the methods and processes described herein. When such methods and processes are implemented, the state of non-volatile storage device 930 may be transformed—e.g., to hold different data.

Non-volatile storage device 930 may include physical devices that are removable and/or built-in. Non-volatile storage device 930 may include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 930 may include nonvolatile, dynamic, static, read/write, read-only, sequential-access, location-addressable, file-addressable, and/or content-addressable devices. It will be appreciated that non-volatile storage device 930 is configured to hold instructions even when power is cut to the non-volatile storage device 930.

Volatile memory 920 may include physical devices that include random access memory. Volatile memory 920 is typically utilized by logic processor 910 to temporarily store information during processing of software instructions. It will be appreciated that volatile memory 920 typically does not continue to store instructions when power is cut to the volatile memory 920.

Aspects of logic processor 910, volatile memory 920, and non-volatile storage device 930 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The terms "module," "program," and "engine" may be used to describe an aspect of classical computing system 900 typically implemented in software by a processor to perform a particular function using portions of volatile memory, which function involves transformative processing that specially configures the processor to perform the function. Thus, a module, program, or engine may be instantiated via logic processor 910 executing instructions held by non-volatile storage device 930, using portions of volatile memory 920. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc.

When included, display subsystem 940 may be used to present a visual representation of data held by non-volatile storage device 930. The visual representation may take the form of a graphical user interface (GUI). As the herein described methods and processes change the data held by the non-volatile storage device, and thus transform the state of the non-volatile storage device, the state of display subsystem 940 may likewise be transformed to visually represent changes in the underlying data. Display subsystem 940 may include one or more display devices utilizing virtually any type of technology. Such display devices may be combined with logic processor 910, volatile memory 920, and/or non-volatile storage device 930 in a shared enclosure, or such display devices may be peripheral display devices.

When included, input subsystem 950 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on-or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity; and/or any other suitable sensor.

When included, communication subsystem 960 may be configured to communicatively couple various computing devices described herein with each other, and with other devices. Communication subsystem 960 may include wired and/or wireless communication devices compatible with one or more different communication protocols. As non-limiting examples, the communication subsystem may be configured for communication via a wireless telephone network, or a wired or wireless local- or wide-area network, such as a HDMI over Wi-Fi connection. In some embodiments, the communication subsystem may allow classical computing system 900 to send and/or receive messages to and/or from other devices via a network such as the Internet.

In one example, a computing system comprises a Majorana island at which a plurality of Majorana zero modes (MZMs) are instantiated; and a grounded region tunably coupled to one of the MZMs. The grounded region comprises at least a two-dimensional electron gas (2DEG) layer; a first dielectric layer that is adjacent to the 2DEG layer; and a grounded gate that directly contacts the 2DEG layer through a via fill. The technical effect of tunably coupling a grounded region to a Majorana island is a reduced error rate. In such an example, or any other example, the grounded gate is additionally or alternatively a first layer gate separated from the 2DEG by at least the first dielectric layer except where directly contacting the 2DEG through the via fill. In any of the preceding examples, or any other examples, the grounded gate is additionally or alternatively routed to ground through a second via fill that extends from the first layer gate through one or more additional dielectric layers. In any of the preceding examples, or any other examples, the grounded gate is additionally or alternatively a second layer gate separated from the 2DEG layer by the first dielectric layer and a second dielectric layer except where directly contacting the 2DEG through the via fill. In any of the preceding examples, or any other examples, the grounded gate is additionally or alternatively routed to ground through via fills that extend through one or more additional dielectric layers. In any of the preceding examples, or any other examples, the computing system additionally or alternatively comprises a first layer gate positioned between the first dielectric layer and the second dielectric layer, the first layer gate surrounding, but not directly contacting, the via fill. In any of the preceding examples, or any other examples, the first layer gate is additionally or alternatively configured to perform one or more of accumulation and depletion of a portion of the 2DEG layer that surrounds the region where the 2DEG layer is contacted by the via fill. In any of the preceding examples, or any other examples, the grounded region is additionally or alternatively indirectly coupled to the MZM via one or more cutter gates. In any of the preceding examples, or any other examples, the grounded region is additionally or alternatively indirectly coupled to the MZM via one or more quantum dot plunger gates.

In another example, a computing system comprises a Majorana island at which a plurality of Majorana zero modes (MZMs) are instantiated; and a grounded region tunably coupled to one of the MZMs. The grounded region comprises at least a two-dimensional electron gas (2DEG) layer; a first dielectric layer that is adjacent to the 2DEG layer; a second dielectric layer; a grounded gate positioned on the second dielectric layer, the grounded gate directly contacting portions of the 2DEG layer through via fill; and a first layer gate positioned between the first dielectric layer and the second dielectric layer, the first layer gate surrounding, but not directly contacting the via fill. The technical effect of tunably coupling a grounded region to a Majorana island is a reduced error rate. In such an example, or any other example, the grounded region is additionally or alternatively operatively adjacent to the Majorana island. In any of the preceding examples, or any other examples, the grounded region is additionally or alternatively separated from the Majorana island via one or more cutter gates. In any of the preceding examples, or any other examples, the grounded region is additionally or alternatively separated from the Majorana island via one or more quantum dot plunger gates. In any of the preceding examples, or any other examples, the first layer gate is additionally or alternatively configured to accumulate electrons in the 2DEG layer responsive to a positive change in applied voltage compared to the depletion voltage of the 2DEG layer. In any of the preceding examples, or any other examples, the first layer gate is additionally or alternatively configured to deplete electrons in the 2DEG layer responsive to a negative change in applied voltage compared to the depletion voltage of the 2DEG layer. In any of the preceding examples, or any other examples, the grounded region is additionally or alternatively tunably connected to one or more additional MZMs. In any of the preceding examples, or any other examples, the grounded region is additionally or alternatively tunably connected to MZMs of two or more Majorana islands.

In yet another example, a method for a quantum computing device comprises performing a first measurement on a Majorana qubit array comprising a Majorana island; while performing the first measurement, maintaining the Majorana island as an electrically floating device; following completion of the first measurement, connecting the Majorana island to ground; and prior to performing a subsequent, second measurement, disconnecting the Majorana island from ground. The technical effect of connecting a Majorana island to ground between measurements is enhanced reliability of the quantum computing device. In such an example, or any other example, the first measurement and second measurement are additionally or alternatively multi-Majorana island measurements. In any of the preceding examples, or any other examples, connecting the Majorana island to ground is additionally or alternatively performed following a predetermined number of measurements.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A computing system comprising:
a Majorana island at which a plurality of Majorana zero modes (MZMs) are instantiated; and
a grounded region tunably coupled to one of the MZMs, the grounded region comprising at least:
a two-dimensional electron gas (2DEG) layer;
a first dielectric layer that is adjacent to the 2DEG layer; and
a grounded gate that directly contacts the 2DEG layer through a via fill.

2. The computing system of claim 1, wherein the grounded gate is a first layer gate separated from the 2DEG by at least the first dielectric layer except where directly contacting the 2DEG through the via fill.

3. The computing system of claim 2, wherein the grounded gate is routed to ground through a second via fill that extends from the first layer gate through one or more additional dielectric layers.

4. The computing system of claim 1, wherein the grounded gate is a second layer gate separated from the 2DEG layer by the first dielectric layer and a second dielectric layer except where directly contacting the 2DEG through the via fill.

5. The computing system of claim 4, wherein the grounded gate is routed to ground through via fills that extend through one or more additional dielectric layers.

6. The computing system of claim 4, further comprising a first layer gate positioned between the first dielectric layer and the second dielectric layer, the first layer gate surrounding, but not directly contacting, the via fill.

7. The computing system of claim 6, wherein the first layer gate is configured to perform one or more of accumulation and depletion of a portion of the 2DEG layer that surrounds the region where the 2DEG layer is contacted by the via fill.

8. The computing system of claim 1, wherein the grounded region is indirectly coupled to the MZM via one or more cutter gates.

9. The computing system of claim 8, wherein the grounded region is indirectly coupled to the MZM via one or more quantum dot plunger gates.

10. A computing system comprising:
a Majorana island at which a plurality of Majorana zero modes (MZMs) are instantiated; and
a grounded region tunably coupled to one of the MZMs, the grounded region comprising at least:
a two-dimensional electron gas (2DEG) layer;
a first dielectric layer that is adjacent to the 2DEG layer;
a second dielectric layer;
a grounded gate positioned on the second dielectric layer, the grounded gate directly contacting portions of the 2DEG layer through via fill; and
a first layer gate positioned between the first dielectric layer and the second dielectric layer, the first layer gate surrounding, but not directly contacting the via fill.

11. The computing system of claim 10, wherein the grounded region is operatively adjacent to the Majorana island.

12. The computing system of claim 10, wherein the grounded region is separated from the Majorana island via one or more cutter gates.

13. The computing system of claim 12, wherein the grounded region is further separated from the Majorana island via one or more quantum dot plunger gates.

14. The computing system of claim 10, wherein the first layer gate is configured to accumulate electrons in the 2DEG layer responsive to a positive change in applied voltage compared to the depletion voltage of the 2DEG layer.

15. The computing system of claim 10, wherein the first layer gate is configured to deplete electrons in the 2DEG layer responsive to a negative change in applied voltage compared to the depletion voltage of the 2DEG layer.

16. The computing system of claim 10, wherein the grounded region is tunably connected to one or more additional MZMs.

17. The computing system of claim 16, wherein the grounded region is tunably connected to MZMs of two or more Majorana islands.

18. A method for a quantum computing device, comprising:
performing a first measurement on a Majorana qubit array comprising a Majorana island;
while performing the first measurement, maintaining the Majorana island as an electrically floating device;
following completion of the first measurement, connecting the Majorana island to ground; and
prior to performing a subsequent, second measurement, disconnecting the Majorana island from ground.

19. The method of claim 18, wherein the first measurement and second measurement are multi-Majorana island measurements.

20. The method of claim 18, wherein connecting the Majorana island to ground is performed following a predetermined number of measurements.

* * * * *